United States Patent [19]
Mallon

[11] 3,745,510
[45] July 10, 1973

[54] PRINTED CIRCUIT BOARD/INTEGRATED CIRCUIT SOCKET COMBINATION

[75] Inventor: Marvin C. Mallon, Canoga Park, Calif.

[73] Assignee: Interdyne Company, Los Angeles, Calif.

[22] Filed: July 2, 1971

[21] Appl. No.: 159,185

[52] U.S. Cl. ............... 339/17 R, 339/14, 339/18 R, 339/128, 339/221 R
[51] Int. Cl. ......................... H01r 13/48, H05k 1/04
[58] Field of Search ................. 339/17, 18, 19, 176, 339/221, 14, 126, 128, 222, 256, 59–61, 192

[56] References Cited
UNITED STATES PATENTS

| | | | |
|---|---|---|---|
| 3,546,539 | 12/1970 | Wilcox, Jr. et al. | 339/17 L X |
| 3,564,479 | 2/1971 | Gluntz | 339/14 R |
| 3,363,223 | 1/1968 | Hardesty et al. | 339/221 R |
| 3,328,749 | 6/1967 | Kurla | 339/221 R |
| 3,137,535 | 6/1964 | Collier et al. | 339/61 M |
| 3,273,104 | 9/1966 | Krol | 339/128 |
| 3,466,589 | 9/1969 | Sherman et al. | 339/14 R |

*Primary Examiner*—Marvin A. Champion
*Assistant Examiner*—Terrell P. Lewis
*Attorney*—Jessup & Beecher

[57] ABSTRACT

An improved printed circuit board and socket combination for integrated circuit elements is provided. Sockets for receiving the terminal pins of integrated circuit units are mounted on a printed circuit board by a press-fit into respective openings in the board. Connections are made between selected protruding terminal pins of the sockets and either a ground or power conductive strip on the circuit board by conductive clips fitted over the selected terminal pins and soldered, or otherwise affixed to the selected conductive strips.

3 Claims, 2 Drawing Figures

PATENTED JUL 10 1973

3,745,510

INVENTOR:
Marvin C. Mallon
Jessup and Beecher
By Keith D. Beecher
ATTORNEY

PRINTED CIRCUIT BOARD/INTEGRATED CIRCUIT SOCKET COMBINATION

BACKGROUND OF THE INVENTION

It is common practice in the prior art to mount the sockets for receiving integrated circuit elements to the circuit board either by bolts and nuts, adhesives, or by solder connections. In contradistinction to the prior art, the sockets for the integrated circuit elements, in accordance with the present invention, are mounted to the circuit board by a press-fit in openings provided in the board for the respective sockets.

In the practice of the present invention, sockets for integrated circuit elements may be mounted on printed circuit boards in varying sizes and configurations. The resulting assembly serves as a means for electrically interconnecting a plurality of integrated circuit units so that they may function as an electronic assembly or sub-assembly. The sockets, as mounted on the circuit board in accordance with the invention, permit the integrated circuit units to be plugged into the sockets from one side of the board, whereas the protruding terminal pins of the sockets may be wired to the printed circuitry on the other side of the board. The resulting electronic assemblies may then serve as integral parts for electronic computers, test apparatus, communication equipment, and the like.

In the practice of the present invention, a projection on the bottom surface of the socket body which has a particular profile is forced into a similarly profiled slot in the printed circuit board. The construction is such that once the socket is forced into the opening in the board, it resists removal, this being achieved by selecting an appropriate resilient plastic for the projection on the socket. The combination of the present invention has advantages over the prior art combinations in that it is less expensive to perform, and does not require additional parts of adhesives. The combination of the invention also provides a simple means whereby the individual socket may be accurately and precisely located on the circuit board.

DETAILED DESCRIPTION OF THE ILLUSTRATED EMBODIMENT

Figure 1:
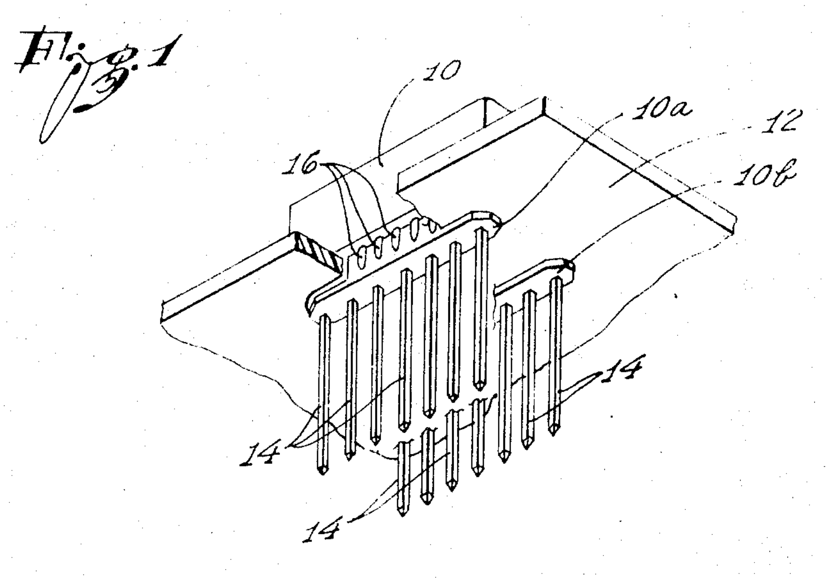
FIG. 1 is a perspective representation of a socket and circuit board combination representing the concept of the invention.

As shown in FIG. 1, a socket 10 is supported in a circuit board 12 by pressing a pair of projections 10*a* and 10*b* on the lower surface of the socket into corresponding slots in the circuit board. The socket 10 may have a construction generally similar to the socket described in Sarazen U.S. Pat. No. 3,517,376. The socket 10, like the socket described in the Sarazen patent, has two rows of female connectors on its upper side for receiving the terminal pins of an integrated circuit unit. The socket assembly also has two rows of elongated terminal pins 14 extending from its other side, the terminal pins 14 being part of or connected to corresponding ones of the female connectors in the socket.

The projections or islands 10*a* and 10*b* surround the respective rows of pins 14, and are formed integral with the body of the socket 10 of any appropriate resilient plastic material. A plurality of ribs 16 may be formed on the sides of each of the islands 10*a* and 10*b* to provide an interference fit with the bore of the slots in the printed circuit panel 12. The projections or islands 10*a* and 10*b* are displaced in from the sides of the body of the socket 10, so that the socket may be pressed against the upper side of the panel 12 with its projections 10*a* and 10*b* extending into the corresponding slots in a press-fit therewith.

Figure 2:
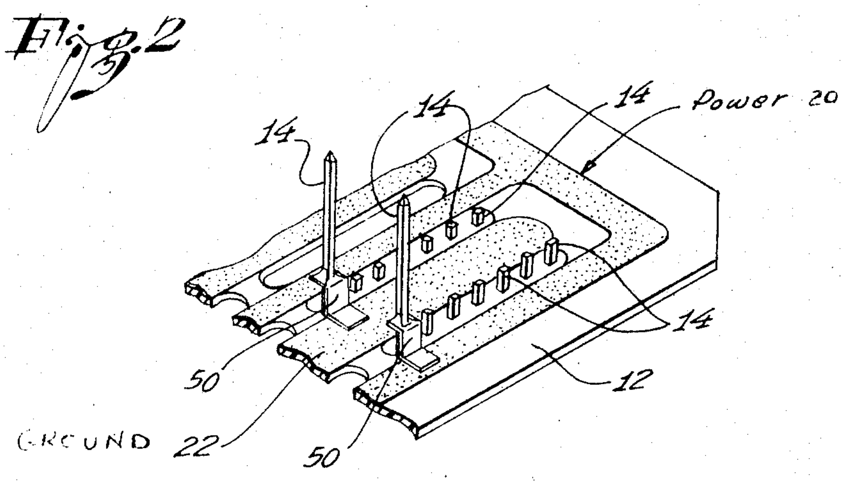
FIG. 2 is a perspective view of the underside of the combination of FIG. 1 to show the manner in which simple clips may be used to connect various ones of the terminal pins of an integrated circuit socket to various conductive strips on the circuit board, in accordance with the invention.

As described above, the upper portion of the socket 10 forms a plug-in receptacle for the multi-pin integrated circuit units, whereas the elongated terminals 14 on the lower portion of the socket provide a means for attaching the socket to interconnecting wires, which complete the electric circuit. In addition, and as shown in FIG. 2, the printed circuit board may have a first set of inter-connected connective strips 20 on its underside which are connected to the power source, and which constitute the power lead for the circuitry.

The circuit board may also have a second series of interconnected printed circuit strips 22 which constitute a ground connection. The terminals 14 extend between the strips 20 and 22, as shown in FIG. 2. Metallic clips 50 are provided, and these clips are slipped down over selected ones of the terminals 14 and are soldered, for example, either to the power strip 20 or to the ground strip 22, the selection being made by establishing a predetermined orientation to the clip 50 as it is slipped down over the selected terminal pin 14.

The right-angled metallic clips 50 provide electrical connections between the printed circuitry on the circuit board and the selected terminals.

As mentioned above, the body of the socket 10 is made of a selected resilient plastic, and the islands 10*a* and 10*b* are formed integral with the body and surround the two groups of the terminal pins 14. The ribs 16 are molded directly on the faces of the islands, and, as mentioned above, these ribs provide an interference fit in the slots provided in the printed circuit board. The ribs are depressed when the socket is pressed into the slots to provide a substantial holding force.

The printed circuitry on the underside of the board, as shown in FIG. 2, provides an inter-digitated arrangement for power connections to each and every socket. As shown in FIG. 2, and as described above, either a power connection or a ground connection can be made to any selected terminal pin 14 merely by orienting the clip 50 so that it may engage the appropriate copper strip 20 or 22. The use of the clips 50 is advantageous since it provides a better electrical path for high current to the socket 10 as compared with the small gate wire used for making such connections in the usual prior art circuits.

The invention provides, therefore, an improved combination which results in a highly flexible, economical structure for providing large numbers of electronic subassemblies.

It will be appreciated that while a particular embodiment of the invention has been shown and described, modifications may be made, and it is intended in the following claims to cover the modificiations which fall within the spirit and scope of the invention.

What is claimed is:

1. In combination: a printed circuit board having printed circuits on at least one surface thereof and having at least one opening therein, and a socket element for an integrated circuit unit fitted into said opening in press-fit with the bore thereof, said socket element having at least one row of female conductors on one side for receiving the terminal pins of an integrated circuit unit, and having at least one row of elongated terminal pins on the other side thereof electrically connected to corresponding ones of said female conductors, said socket element having at least one island of resilient plastic material surrounding the row of said elongated terminal pins and displaced inwardly from the peripheral edges of said socket element, said island being received in said opening in said circuit board in press-fit with the bore thereof, said printed circuits on said printed circuit board including a first set of interconnected conductive power strips, and a second set of interconnected conductive ground strips, and further including clips fitted over selected ones of said elongated terminal pins and electrically connected selectively to said power strips and to said ground strips.

2. The combination defined in claim 1, in which said socket element has two rows of said female connectors on one side thereof and two rows of said elongated terminal pins projecting from the other side thereof, and having islands of resilient plastic material surrounding each of said rows of said elongated terminal pins, each of said islands being displaced inwardly from the peripheral edges of said socket element, said islands being received in pairs of said openings in said circuit board in individual press-fit with the respective bores thereof.

3. The combination defined in claim 2, and which includes integral ribs formed on the side of each of said islands to form an interference fit between the islands and the bores of said openings.

* * * * *